(12) United States Patent
Nozawa et al.

(10) Patent No.: US 6,660,089 B2
(45) Date of Patent: Dec. 9, 2003

(54) SUBSTRATE SUPPORT MECHANISM AND SUBSTRATE ROTATION DEVICE

(75) Inventors: Naoyuki Nozawa, Inagi (JP); Terushige Takeyama, Fuchu (JP); Miho Sakai, Fuchu (JP)

(73) Assignee: Anelva Corporation, Fuchu (JP)

( * ) Notice: Subject to any disclaimer, the term of this patent is extended or adjusted under 35 U.S.C. 154(b) by 230 days.

(21) Appl. No.: 09/772,853

(22) Filed: Jan. 31, 2001

(65) Prior Publication Data

US 2001/0010256 A1 Aug. 2, 2001

(30) Foreign Application Priority Data

Jan. 31, 2000 (JP) ........................................ 2000-022437

(51) Int. Cl.[7] .............................................. B05C 13/00
(52) U.S. Cl. ...................................... 118/500; 369/270
(58) Field of Search ................................. 118/500, 728, 118/729, 730; 369/270, 271

(56) References Cited

U.S. PATENT DOCUMENTS 5,543,022 A    8/1996  Nguyen et al.
5,938,902 A  * 8/1999  Nguyen et al. ........ 204/298.15

FOREIGN PATENT DOCUMENTS

| JP | 3-44860 | 2/1991 | |
| JP | 10-194451 | 7/1998 | |
| JP | 2832751 | 12/1998 | |
| JP | 64-48279 | 2/1999 | |
| JP | 64-48280 | 2/1999 | |
| JP | 11-353646 | * 12/1999 | |

* cited by examiner

*Primary Examiner*—Gregory Mills
*Assistant Examiner*—Sylvia R. MacArthur
(74) *Attorney, Agent, or Firm*—Burns, Doane, Swecker & Mathis, LLP

(57) ABSTRACT

A substrate support mechanism of the present invention, which holds the inner rim of a disc substrate having an opening at its center, comprises: a hollow cylindrical member; a central shaft having a tapered portion disposed in the cylindrical member so as to be axially pushed by a first spring; and a plurality of radially movable members, each of which is pushed inwardly by a second spring and has a click to grip the inner rim; whereby the axial motion of the central shaft is converted by the tapered portion to the radial motion of said radially movable members to grip and release said substrate.

A substrate rotation device includes a mechanism for axially moving the cylindrical member; a mechanism for axially moving the central shaft; and a mechanism for rotating the cylindrical member in addition to the substrate support mechanism.

8 Claims, 5 Drawing Sheets

SUBSTRATE SUPPORT MECHANISM AND SUBSTRATE ROTATION DEVICE

BACKGROUND OF THE INVENTION

1. Field of the Invention

This invention relates to a substrate support mechanism and a substrate rotation device for a disc substrate having an opening at its center and in particular to a substrate rotation device preferably used when the substrate is treated in a vacuum processing apparatus such as a film forming apparatus.

2. Description of the Related Art

In recent years, the density of recording media such as a magnetic disc and optical disc has remarkably increased. Nevertheless, a variety of investigations are continued to develop high performance discs having a higher recording density and reliability, and to establish the mass production method thereof.

For example, a magnetic disc is usually composed of an aluminum or glass disc substrate having an opening and multi-layered films formed thereon of a underlayer film such as Cr, a multi-component magnetic film such as CoCrTa and a passivation film such as carbon.

In the production of such a magnetic disc, a substrate holder which supports the substrate at the outer rim with clicks travels through a series of a heating chamber, a sputtering chamber for Cr film, a sputtering chamber for a magnetic film and a plasma CVD chamber for a carbon film, to form the respective films on the substrate.

The substrate holder is placed so that the substrate faces a target or a discharging electrode when transported into the film forming chamber, and then the film formation is carried out in the condition that the substrate is at rest. For the formation of a multi-component magnetic film, an alloy target with a prescribed composition ratio is usually used and a bias voltage is applied to the substrate during sputtering to obtain a high quality magnetic film. The bias application is also indispensable to form a diamond-like carbon film as a passivation film.

In order to prepare a magnetic disc with a higher recording density and reliability, further improvement is required in the uniformity of e.g. coercive force across the substrate by increasing the uniformity of film thickness and composition ratio in addition to the improvement in the magnetic characteristic itself of the film. For example, there is known a method to improve the uniformity of film thickness, in which the arrangement and the shape of the magnets, which are disposed behind the target, are adjusted to optimize the magnet field over the target surface. Although the uniformity of the film thickness is improved, this method has a disadvantage in that the adjustment takes much time.

Then, in order to obtain a higher quality magnetic film, the constituent elements and their composition ratios of the magnetic film need to be optimized, which is however difficult so long as the conventional sputtering apparatuses are adopted. That is, a lot of alloy targets composed of various elements and composition ratios must be provided and then the film forming condition is optimized for each target. Thus, it will require much labor and a long time to determine the desired target composition. In addition, there is the case where the alloy targets cannot be prepared, depending on the composition.

In contrast, the structure of the magnetic film in which the composition ratio varies in the direction of film thickness has been proposed to suppress the long-term decreasing rate of coercive force. However, it is impossible to change the composition in the direction of thickness so long as the above-mentioned apparatus is used.

Then, the present inventors have examined a film forming method, in which, for example, a plurality of disc substrates are fixed to a large substrate holder on the circumference with a prescribed diameter, a plurality of targets are also disposed on the identical circumference, and the substrate holder is rotated so that each substrate revolves and passes under the targets. Since the targets of single element constituting the film can be used in this method, the magnetic films with various composition ratios can be easily formed by adjusting RF power supplied to respective targets. However, the magnetic film thus obtained tends to have a layered structure of respective elements; therefore the large substrate holder must be rotated at a very high speed to obtain a homogeneous film.

In the production of magnetic discs, a Cr underlayer film, a magnetic film, and a passivation film are successively formed in respective film forming chambers. Therefore, each chamber needs to have the same rotation mechanism of the large substrate holder, which makes a hard disc manufacturing system very large and expensive. Furthermore, the substrate holder becomes also complicated and expensive in such a configuration though it is desired to be simple in structure and inexpensive because the blast treatment is periodically carried out to remove films deposited on the holder As mentioned above, the electric bias is indispensable to form a magnetic film or diamond-like carbon film. However, when a glass substrate is employed, the electric contact resistance between the substrates and clicks is large, which causes the clicks to electrically separate from the substrate in most cases, even after a Cr underlayer is formed. As the result, the uniform bias cannot be applied to whole film formation surface. This does not permit the stable and reproducible production of high quality magnetic films.

Under these circumstances, the present inventors have further examined the structures of a film forming apparatus and a substrate holder to overcome above-mentioned disadvantages of prior art, and found that the uniformity of magnetic characteristics and film thickness could be improved by using a sputtering apparatus shown in FIG. 5 and in some case by placing a film distribution correction plate between targets and a substrate. In this configuration, targets 55, 55' and 55" made of single element constituting the magnetic film are disposed over the substrate 100, which is rotated around its central axis. It was also found that the configuration of FIG. 5 makes it possible to form magnetic films of various composition ratios and magnetic films whose composition varies in the direction of the film thickness.

In the formation of such films, a substrate rotation device is required which receives a substrate from a substrate holder transported into the film forming chamber and rotates the substrate facing the targets as shown in FIG. 5. And in order to prevent the enlargement of the film forming chamber, the space for transferring a substrate between the substrate holder and the substrate rotation device should be as small as possible. Therefore, the mechanism is desired to transfer the substrate between the substrate holder and the substrate rotation device without moving the substrate holder. In addition, in order to increase the productivity, a substrate rotation device, which copes with simultaneous film formation on both surfaces of the substrate, is desired.

SUMMARY OF THE INVENTION

Therefore, a principal object of this invention is to provide a substrate rotation device which receives a substrate from a substrate holder transported into the chamber without moving the substrate holder, and rotates the substrate at the same position as supported by the holder.

A further object of this invention is to provide a compact substrate rotation device, which makes it possible to apply the uniform electric bias to the whole film formation surface in a series of the formation of films including a metal film. It is also an object of this invention to provide a compact substrate rotation device, which will not obstruct the simultaneous film formation on both sides of the substrate.

Another object of this invention is to provide a substrate support mechanism, which firmly and securely grips a substrate to meet the substrate rotation device of this invention.

A substrate support mechanism of this invention, which holds the inner rim of a disc substrate having an opening at its center, comprises:

a hollow cylindrical member; a central shaft disposed in the hollow portion of said cylindrical member so as to be pushed in the axial direction by a first spring, said central shaft having at one end portion a tapered portion of which diameter increases toward the end; and a plurality of radially movable members disposed on the end face of said cylindrical member, each radially movable member being pushed inwardly by a second spring and having a click to grip the inner rim of said substrate; whereby the axial motion of the said central shaft is converted to the radial motion of said radially movable members to grip and release said substrate.

Since the radially outward force is exerted on the radially movable members by the action of the first spring and tapered portion, the substrate is securely supported at the inner rim and therefore will not shake or sway during the rotation. Moreover, a substrate support mechanism can be made small in side since the support and release operations of the substrate is carried out by means of the conversion of the axial motion of central shaft to radial motion of the radially movable members.

A substrate rotation device of this invention, which receives a disc substrate having an opening at its center from a substrate holder which holds the outer rim of said substrate with clicks and rotates said substrate in a processing chamber isolated from atmosphere, comprises;

a substrate support mechanism which is composed of a first hollow cylindrical member, a central shaft disposed in the hollow portion of said first hollow cylindrical member so as to be pushed in the axial direction by a first spring, said central shaft having at one end portion a tapered portion of which diameter increases toward the end, and a plurality of radially movable members disposed on one end face of said first hollow cylindrical member, each radially movable member being pushed inwardly by a second spring and having a click to grip the substrate at the inner rim, whereby the axial motion of the said central shaft is converted into the radial direction motion of said radially movable members to grip and release said substrate; a mechanism for moving said first hollow cylindrical member in the axial direction, by which said plurality of radially movable members are inserted into the opening of said substrate to the position where said clicks become at nearly the same level as said substrate; a mechanism for moving said central shaft in the axial direction; and a mechanism for rotating said first hollow cylindrical member while the clicks of said radially movable members grip said substrate.

Only the substrate is rotated whereas the substrate holder itself is at rest in this construction, which enables to make the substrate rotation device simple and small. Furthermore, the substrate rotation device does not require the additional space to transfer a substrate or interfere with the substrate holder, a shield plate or other members in the processing chamber since the substrate is transferred from the substrate holder and is rotated at the same position as supported by the substrate holder.

Accordingly, a processing apparatus can be made compact. It is also possible to carry out the simultaneous sputtering by disposing two sets of targets over both sides of the substrate, wherein the films are formed on both surfaces of the substrate at the same time.

A substrate rotation device is also characterized in that a second hollow cylindrical member is disposed in an opening formed in a wall of said processing chamber and connected at one end face to the other end face of said first cylindrical member, a rotation seal member is disposed around said second hollow cylindrical member and connected to said wall through a first bellows, a driving shaft to move said central shaft in the axial direction is disposed in said second hollow cylindrical member so as to protrude from the other end face of said second hollow cylindrical member, and said other end face of said second hollow cylindrical member is connected to the protruding end of said driving shaft through a second bellows.

This construction is preferably applied to very high vacuum apparatuses. That is, the chamber can be maintained at high vacuum during the operations of the transfer and rotation of the substrate. This permits the formation of a variety of high quality films.

It is preferable that a substrate rotation device is constructed such that said second hollow cylindrical member is electrically insulated from said rotation seal member and a mechanism for moving said second hollow cylindrical member in the axial direction and rotating said second hollow cylindrical member so that a bias voltage is applied to the substrate through said second hollow cylindrical member during the rotation of said substrate.

As mentioned above, since the substrate is gripped at its inner rim after transported into the processing chamber, if a conductive film is formed in the previous process chamber, the clicks of the substrate support mechanism are securely connected to the conductive film. Thus, the uniform bias can be applied to the whole thin film formation surface of the substrate, which enables the stable formation of higher quality thin films.

BRIEF DESCRIPTION OF DRAWINGS

FIG. 5 is a schematic plan view showing the target configuration of the sputtering apparatus which the substrate rotation device of this invention is preferably applied to.

DESCRIPTION OF THE PREFERRED EMBODIMENTS

Figure 1:
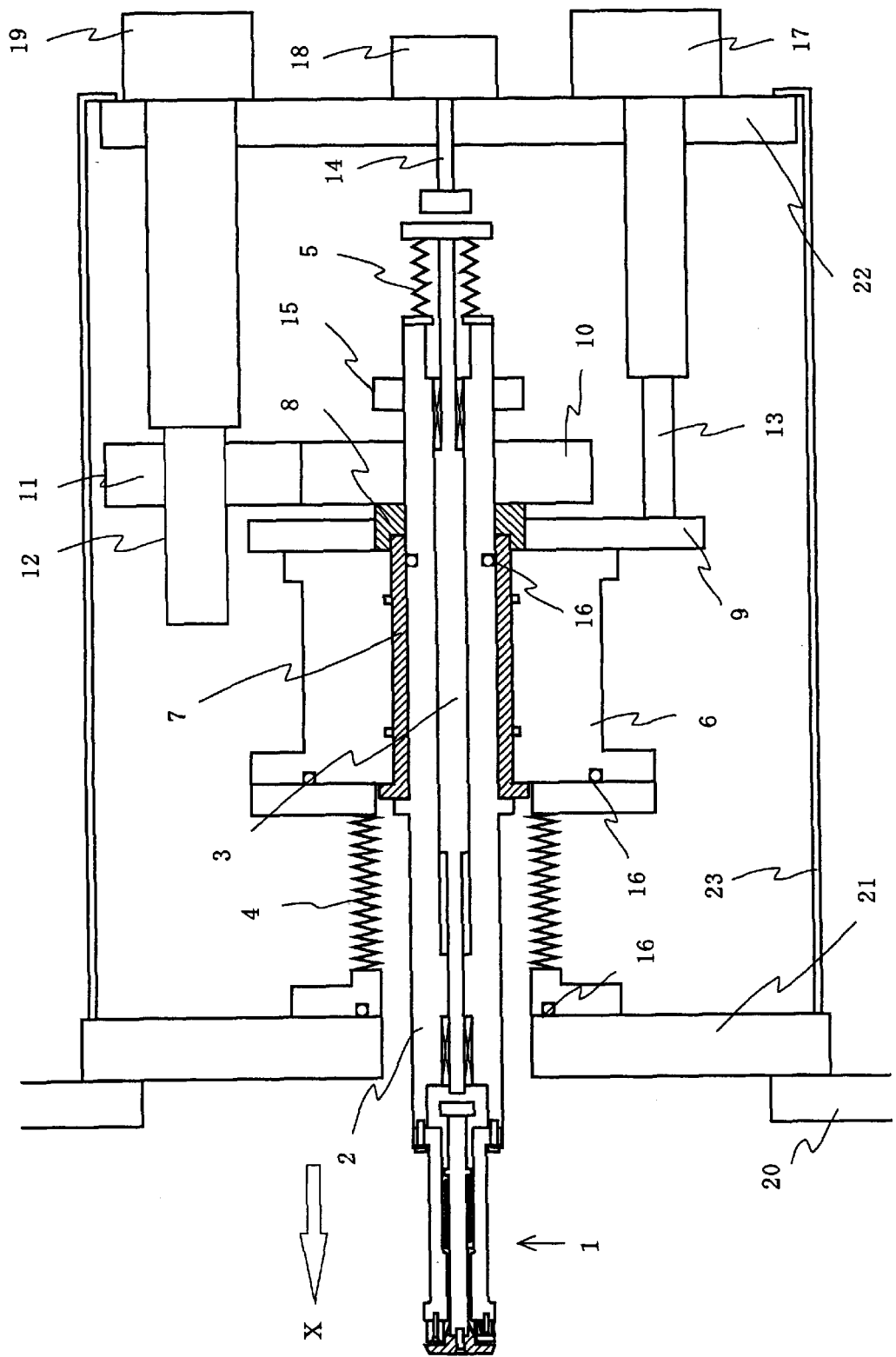
FIG. 1 is a schematic sectional view showing a substrate rotation device of this invention.

The embodiments of this invention will be explained by the reference of the drawings. FIG. 1 is a schematic sectional view showing a substrate rotation device of the present invention. In this example, the substrate rotation device is installed at a sidewall 20 of a vacuum chamber.

The substrate rotation device is mainly composed of a substrate support mechanism 1 which supports a substrate, a cylindrical member (i.e. a second hollow cylindrical member) 2 which moves in the axis direction and rotate, and a driving shaft 3 which moves in the axis direction to carry out the gripping and releasing operation of the substrate. Here, a first bellows 4 and a second bellows 5 are disposed in order to move cylindrical member 2 and driving shaft 3 in the axial direction, respectively, keeping the processing chamber air tight, A magnetic fluid seal member 6 is also disposed to rotate cylindrical member 2. In the figure, the numeral 16 denotes an O-ring.

A gear 10 is disposed around cylindrical member 2. The rotation motion of a motor 19 is transmitted to cylindrical member 2 through gear 10, a spline shaft 12, and a gear 11. The gear 10 is made of an insulator such as resin so that cylindrical member 2 is electrically insulated from motor 19. And cylindrical member 2 can be moved in the axial direction by a piston rod 13 of an air cylinder 17 fixed on a support plate 9.

In the example of the figure, gears 10, 11 moves together with cylindrical member 2 in the axial direction, and bellows 4 expands and contracts together with the axial motion of cylindrical member 2. The cylindrical member 2 is electrically insulated from magnetic fluid seal member 6 and air cylinder 17 with the aid of a ceramic insulator 7 which is disposed between cylindrical member 2 and magnetic fluid seal member 6, and a ceramic member 8.

By arranging insulators 7, 8, it becomes possible to apply the voltage to cylindrical member 2, and therefore to apply the uniform bias to the film formation surface of the substrate through the substrate support mechanism which is electrically connected to the surface. The bias voltage may be applied by connecting a RF or DC power source to, for example, a bearing 15.

The driving shaft 3 is caused to move in the axial direction by the motion of piston rod 14 of air cylinder 18. This makes possible the gripping and releasing operation of a substrate, as will be described later. The driving shaft 3 is separated from piston rod 14 when cylindrical member 2 is rotated. And bellows 5 expands and contracts with the axial motion of driving shaft 3.

The members mentioned above might also be supported by posts, guides and the like which are fixed to side plates 21, 22.

Figure 2:
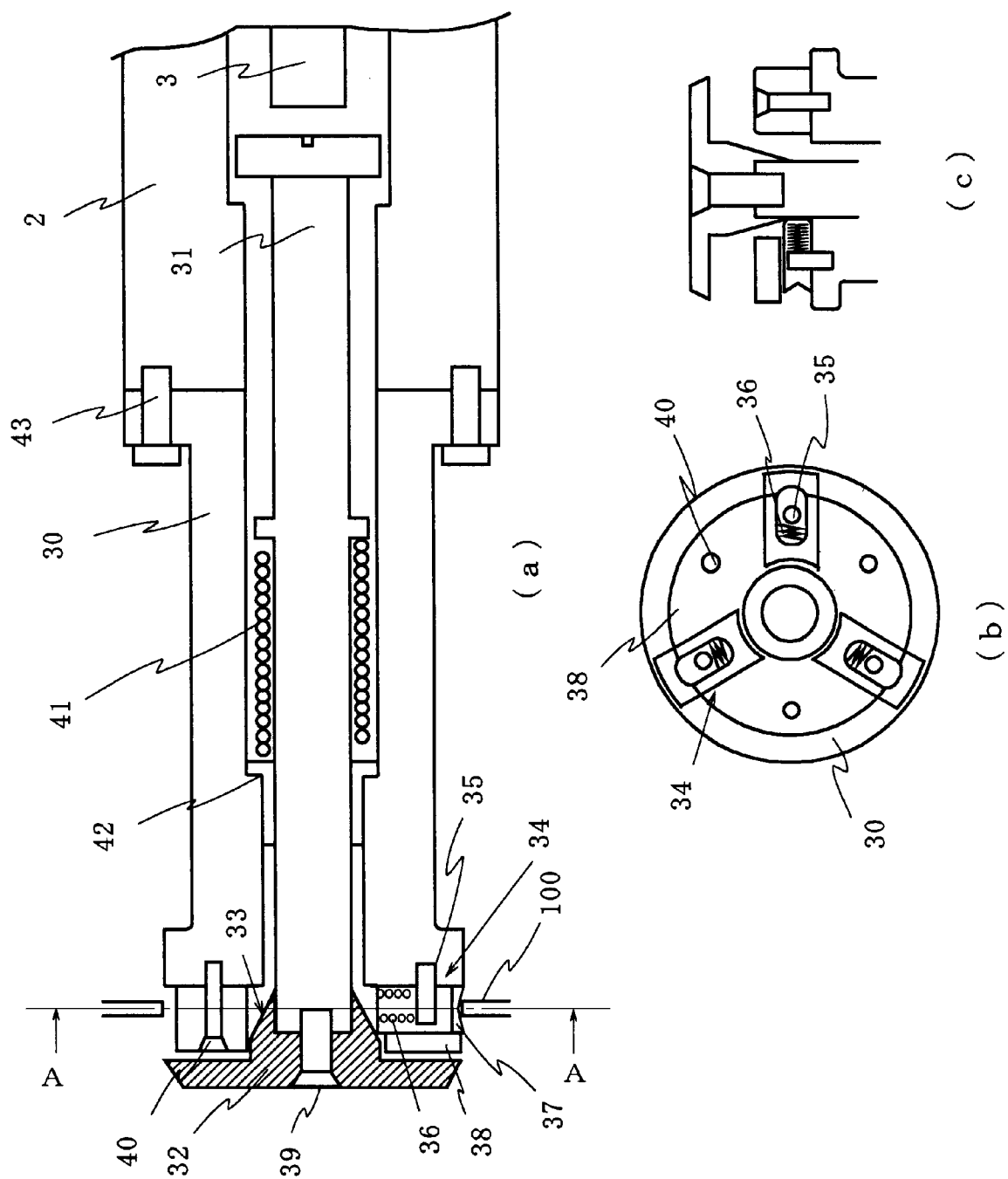
FIGS. 2(a)–2(c) is schematic views showing a substrate support mechanism of this invention.

Next, substrate support mechanism 1 is explained by referring to FIG. 2. FIG. 2(a) is a schematic sectional view showing substrate support mechanism 1 which holds a substrate. FIG. 2(b) is a view taken along A—A line of FIG. 2(a) and FIG. 2(c) is a sectional view of substrate support mechanism 1 before (or after) holding a substrate.

The substrate support mechanism 1 is composed of a hollow cylindrical member (i.e. a first hollow cylindrical member) 30, a central shaft 31 protruding hollow cylindrical member 30, and a plurality of radially movable members 34 disposed on one end face of hollow cylindrical member 30. The other end face of hollow cylindrical member 30 is fixed to one end face of second hollow cylindrical member 2 with bolts 43.

The radially movable member 34 is a block in rectangular prism shape in which a slit-like hole is provided to insert a pin 35 fixed on the one end face of cylindrical member 30. At one end of the block, a click 37 having V shaped groove is provided to grip the inner rim of the substrate. The pin 35 and a spring (i.e. a second spring) 36 are inserted in the slit like hole so that the block is pushed toward central shaft 31. In the example of the figure, three radially movable members are disposed. In addition, guides 38 are also fixed on cylindrical member 30 with screws 40 in order to prevent members 34 from rotating and only to allow the reciprocating motion in the radial direction. Here, copper and lubricant resin are preferably used for guide 38 and member 34, respectively, to ensure the smooth reciprocating motion.

A block 32 having a tapered portion 33 in which the cross sectional diameter increases toward the end is fixed on one end portion of central shaft 31 with a screw 39, and is pushed toward cylindrical member 2 by a compression spring 41.

In the state that block 32 is pushed in, radially movable members 34 are pushed outwards by taper portion 33 of block 32, which results in making clicks with V shaped groove formed at the tip of members 34 contact the inner rim and support the substrate. When the substrate is, on the other hand, released, air cylinder 18 is driven to move driving shaft 3 forwards and to press central shaft 31 against the force of compression spring 41. The block 32 is also moved and radially movable members 34 which have been pushed out toward outer circumference by tapered portion 33 are moved toward central shaft 31 by the force of spring 36, as shown in FIG. 2(c). As a result, clicks are separated from the inner rim of the substrate. That is, the substrate is released.

As has been described, the axial motion of central shaft 31 is converted to the reciprocating motion of radially movable members 34 through the action of tapered portion, by which the substrate is supported and released.

Figure 3:
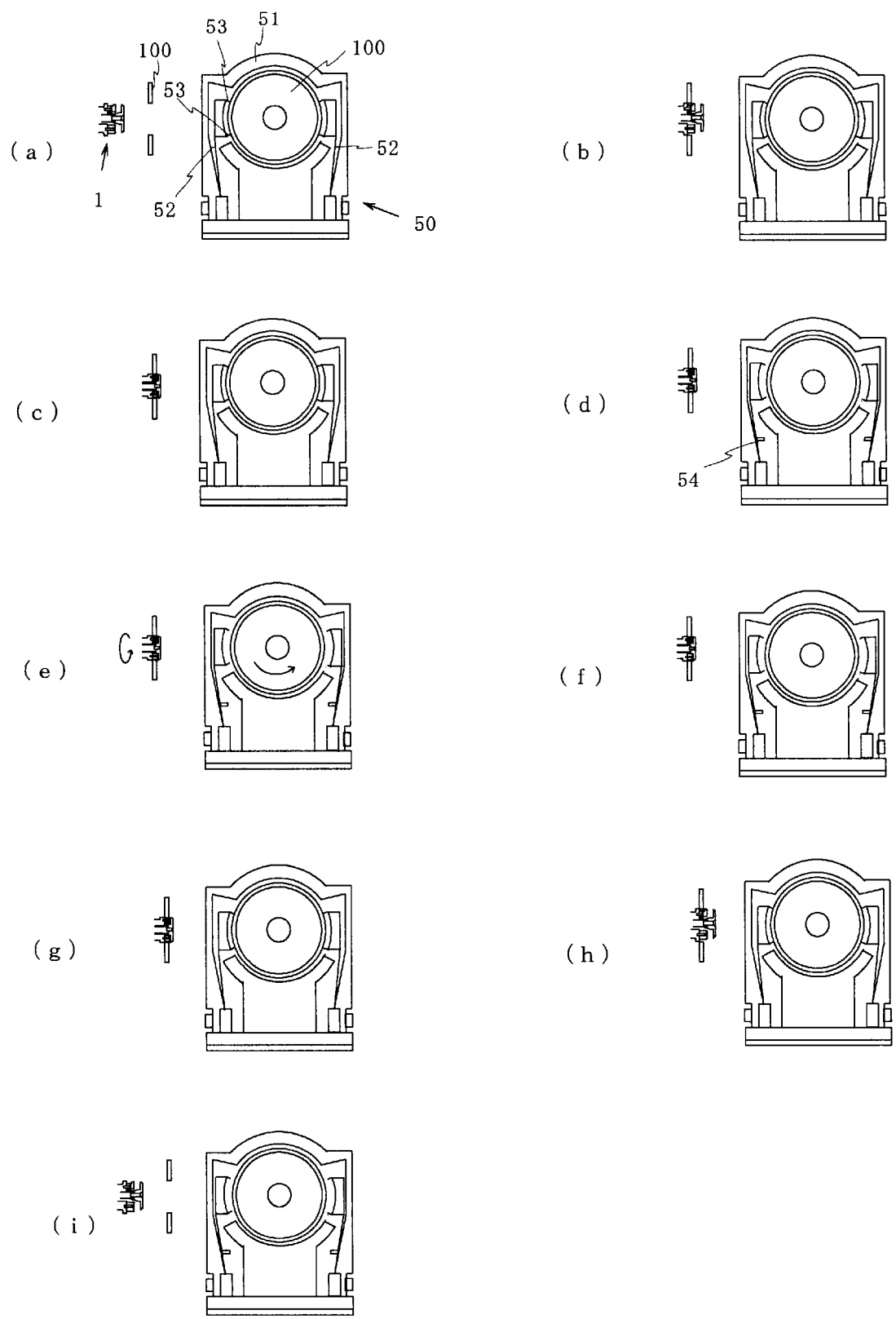
FIGS. 3(a)–3(i) are schematic views which explain the operation of the substrate rotation device.

Next, a series of operations of the substrate rotation device, which receives the substrate from a substrate holder, carries out a prescribed treatment under the rotation of the substrate, and then returns the substrate to the holder, are explained by referring to FIG. 3.

In each of FIGS. 3(a)~(i), the right side figure is a side view showing the configuration of substrate 100 and substrate holder 50, and the left side figure is a sectional view showing the configuration of the substrate support mechanism 1 and substrate 100. The substrate holder 50 is composed of a frame 51 surrounding substrate 100 and two arms 52 fixed on frame 51. Two clicks 53 are disposed at the tip portion of each arm 52. The arm 52 is made of an elastic member such as a plate spring and the force is exerted so that clicks 53 push and grip the outer rim of the substrate 100. The substrate holder 50 is transported between processing chambers, supporting the substrate at the outer rim with clicks 53.

Figure 5:
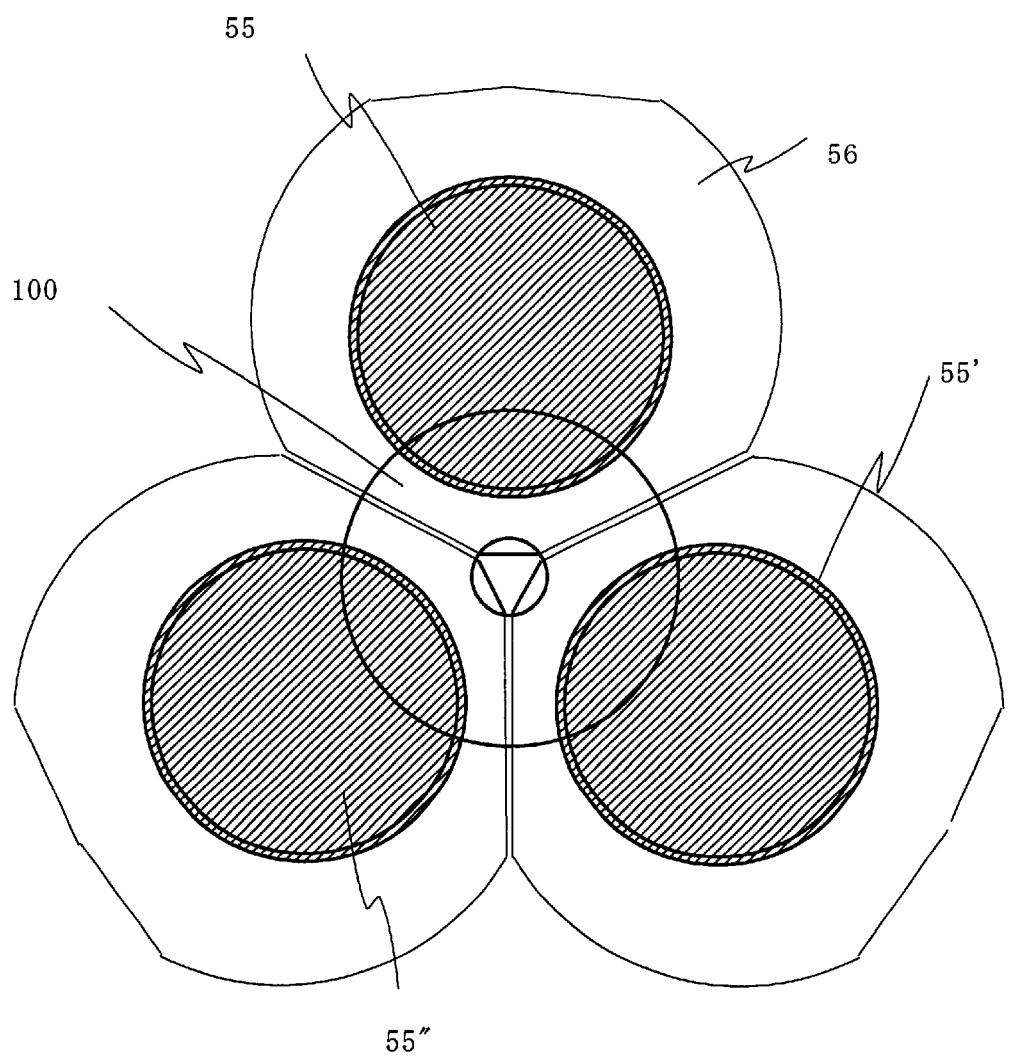

After a Cr underlayer film is formed, as shown in FIG. 3(a), the substrate holder is carried into the sputtering chamber for a magnetic film formation, and placed on a substrate holder support (not illustrated) which is disposed between targets shown in FIG. 5 and substrate rotation device. At this stage, air cylinder 18 is driven to move driving shaft 3 forwards. As the result, central shaft 31 and block 32 are pressed leftwards (in the direction of arrow X in FIG. 1); in other words, radially movable members 34 are shifted to the central shaft side by springs 36.

Next, air cylinder 17 is driven to advance cylindrical member 2 and insert the tip of substrate support mechanism 1 into the opening of the substrate until the center of V shaped groove of clicks 37 comes to the same position of the inner rim of substrate 100 (FIG. 3(b)).

Then, piston rod 14 of air cylinder 18 is moved backwards. When driving shaft 3 moves back and separates from the end of central shaft 31, block 32 moves back by the force of compression spring 41. As the result of such movements, radially movable members 34 are pushed outwards to grip the inner rim of the substrate(FIG. 3(c)). Here, clicks 37 grip the portion on which a Cr film is formed, and therefore are electrically connected to the film formation surface of the substrate.

Then, a substrate gripping and releasing mechanism 54 of the substrate holder is operated to push apart two arms 52 of the substrate holder and to separate clicks 53 from the outer rim of the substrate. Thus, the substrate is released from the substrate holder (FIG. 3(d)).

The motor is driven to rotate cylindrical member 2 and the substrate at a prescribed speed. Then, a gas is introduced into the processing chamber and the electric powers are supplied to respective cathodes. The plasma is generated and a magnetic film is formed on the Cr underlayer film.

The uniform bias can be applied to the film formation surface of the substrate during the magnetic film formation, by applying DC or RF voltage to, e.g., bearing 15 (FIG. 3(e)).

After the magnetic film with a prescribed thickness is formed, the power supply to the cathodes is cut off and the motor is turned off to stop the substrates (FIG. 3(f)). Then, the substrate grip/release mechanism 54 is retreated so that the substrate is supported at the outer rim by clicks 53 of the substrate holder (FIG. 3(g)).

After that, the cylinder 18 is driven to press block 32 leftwards. The radially movable members 34 are retreated toward the central shaft to separate clicks 37 from the inner rim. Thus, the substrate is released from the substrate rotation device (FIG. 3(h)). Finally, cylindrical member 2 moves backwards to retreat block 32 from the opening of the substrate (FIG. 3(i)).

After a series of operations of substrate support, release and rotation using the substrate rotation device is finished, the substrate holder, which supports the treated substrate, is transported out to the processing chamber of next process. And the substrate holder, which supports a substrate to be treated, is transported in the sputtering chamber and the same operations are carried out.

The film formation on one surface of the substrate has been described so far. It is also possible to simultaneously form the same film on both surfaces of the substrate. In this case, another set of targets are installed on sidewall 20, surrounding cylindrical member 2, and electric power is supplied to both sets of cathodes to generate plasma.

Figure 4:
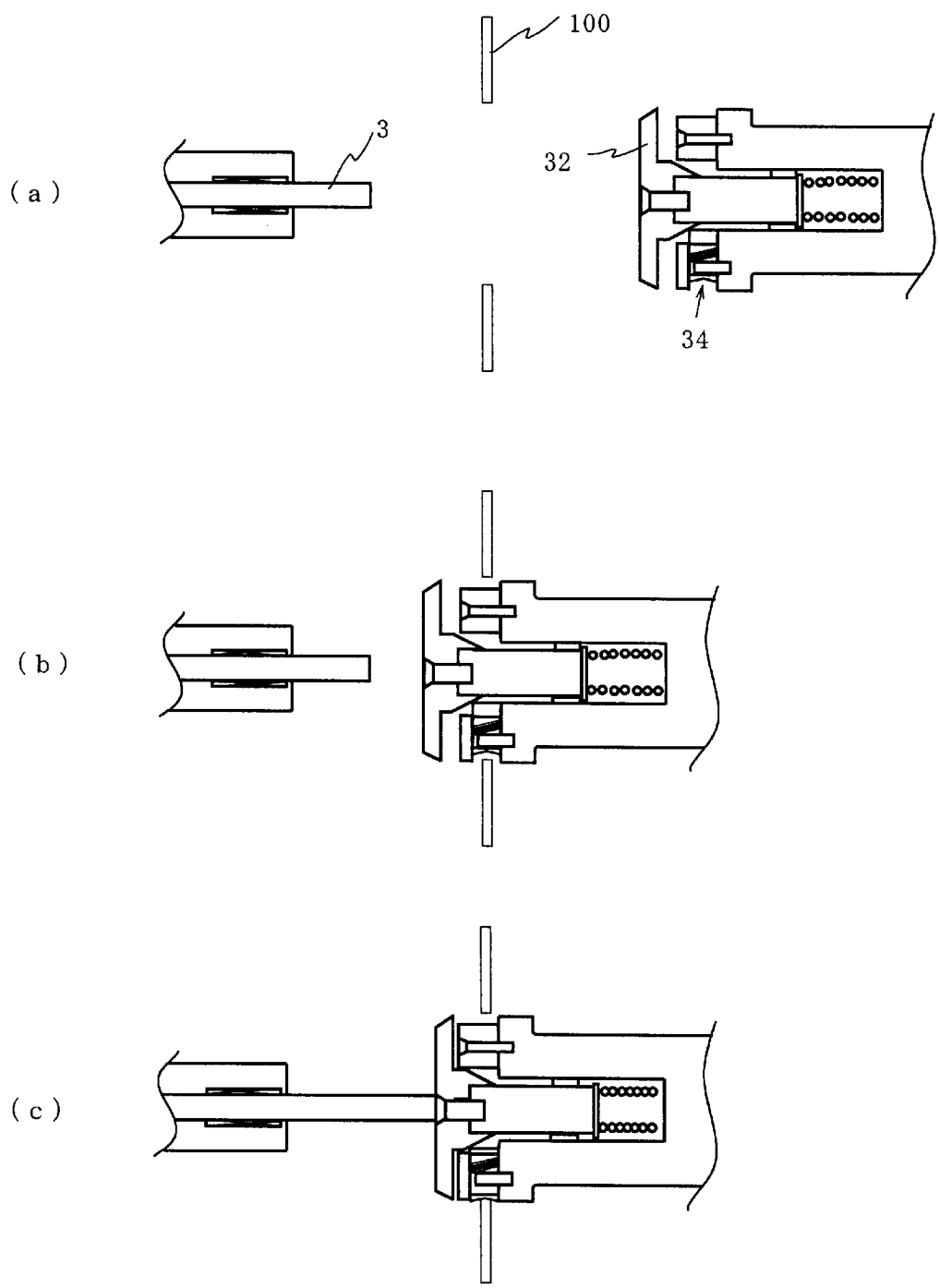
FIG. 4 is a schematic sectional view showing another substrate rotation device of this invention.

In the construction shown in FIG. 1, the compression spring 41 is disposed so as to push central shaft 31 in the direction of the second cylindrical member. However, the compression spring can be disposed so as to push the central shaft in the opposite direction. In this case, as shown in FIG. 4, driving shaft 3 and air cylinder 18 to move the central shaft are disposed in the opposite side of the substrate to central shaft 31. And block 32 is pushed out by the compression spring and radially movable members 34 are retreated in the central shaft side, as shown in FIGS. 4(a) and 4(b). Therefore, in order to support the substrate, block 32 is pressed by driving shaft 3 as shown in FIG. 4(c). In this case, driving shaft 3 rotates together with the substrate. The driving shaft 3 may be inserted through the central portion of three cathodes shown in FIG. 5.

The embodiments mentioned above refer to the arrangement where the substrate rotation device is installed horizontally. However, it is also possible to vertically install the device. And the substrate rotation device of the present invention can be preferably applied to a variety of film formation apparatuses and processing apparatuses such as a plasma CVD apparatus and a dry etching apparatus as well as a sputtering apparatus mentioned above. In addition, this invention can be also used, for example, for the rotation of a substrate in a heating or cooling process, which makes it possible to improve the temperature uniformity in the substrate.

As has been mentioned, the present invention provides a compact substrate support mechanism, which securely supports and smoothly rotates a substrate without causing shaking or vibration.

And since a substrate holder can be at rest while a substrate rotates, it becomes possible not only to provide a simple and compact substrate rotation device, but also to make the substrate holder and its transporting mechanism simple in structure. Thus, the rotation device can cope with the simultaneous film formation on both surfaces of the substrate.

This invention particularly contributes to the development of high quality recording discs and small size manufacturing systems therefor.

What is claimed is:

1. A substrate support mechanism which holds the inner rim of a disc substrate having an opening at its center, comprising:

a hollow cylindrical member;

a central shaft disposed in the hollow portion of said cylindrical member so as to be pushed in the axial direction by a first spring, said central shaft having at one end portion a tapered portion of which diameter increases toward the end; and a plurality of radially movable members disposed on the end face of said cylindrical member, each radially movable member being pushed inwardly by a second spring and having a click to grip the inner rim of said substrate;

whereby the axial motion of the said central shaft is converted to the radial motion of said radially movable members to grip and release said substrate.

2. The substrate support mechanism according to claim 1, wherein the click comprises a groove at an outer edge of each of the plurality of radially movable members.

3. A substrate rotation device which receives a disc substrate having an opening at its center from a substrate holder which holds the outer rim of said substrate with clicks and rotates said substrate in a processing chamber isolated from atmosphere, comprising;

a substrate support mechanism including a first hollow cylindrical member, a central shaft disposed in the hollow portion of said first hollow cylindrical member so as to be pushed in the axial direction by a first spring, said central shaft having at one end portion a tapered portion of which diameter increases toward the end, and a plurality of radially movable members disposed on one end face of said first hollow cylindrical member, each radially movable member being pushed inwardly by a second spring and having a click to grip the substrate at the inner rim, whereby the axial motion of the said central shaft is converted into the radial direction motion of said radially movable members to grip and release said substrate;

a mechanism for moving said first hollow cylindrical member in the axial direction, by which said plurality of radially movable members are inserted into the opening of said substrate to the position where said clicks become at nearly the same level as said substrate;

a mechanism for moving said central shaft in the axial direction; and a mechanism for rotating said first hollow cylindrical member while the clicks of said radially movable members grip said substrate.

4. The substrate rotation device according to claim 3, wherein a second hollow cylindrical member is disposed in an opening formed in a wall of said processing chamber and connected at one end face to the other end face of said first cylindrical member, a rotation seal member is disposed around said second hollow cylindrical member and connected to said wall through a first bellows, a driving shaft to move said central shaft in the axial direction is disposed in said second hollow cylindrical member so as to protrude from the other end face of said second hollow cylindrical member, and said other end face of said second hollow cylindrical member is connected to the protruding end of said driving shaft through a second bellows.

5. The substrate rotation device according to claim 4, wherein said second hollow cylindrical member is electrically insulated from said rotation seal member and a mechanism for moving in the axial direction and rotating said second hollow cylindrical member so that bias voltage is applied to the substrate through said second hollow cylindrical member during the rotation of said substrate.

6. The substrate support mechanism according to claim 3 wherein the click comprises a groove at an outer edge of each of the plurality of radially movable members.

7. A substrate support mechanism which holds an inner rim of a disc substrate having an opening at its center, comprising:

a hollow cylindrical member;

a central shaft disposed in a hollow portion of said cylindrical member so as to be pushed in an axial direction by a first spring, said central shaft having at one end portion a tapered portion of which diameter increases toward the end; and a plurality of radially movable members disposed on the end face of said cylindrical member, each radially movable member being pushed inwardly by a second spring and having a click to grip the inner rim of said substrate;

whereby the axial motion of the said central shaft causes the tapered portion to engage the plurality of radially movable members to radially move said radially movable members against the respective second springs to grip and release said substrate.

8. The substrate support mechanism according to claim 7 wherein the click comprises a groove at an outer edge of each of the plurality of radially movable members.

* * * * *